(12) United States Patent
Krug et al.

(10) Patent No.: US 11,921,176 B2
(45) Date of Patent: Mar. 5, 2024

(54) MAGNETIC RESONANCE IMAGING DEVICE WITH A CURVED FIELD GENERATION UNIT

(71) Applicant: Siemens Healthcare GmbH, Erlangen (DE)

(72) Inventors: Andreas Krug, Fürth (DE); Michael Mallett, Faringdon (GB)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/705,871

(22) Filed: Mar. 28, 2022

(65) Prior Publication Data

US 2022/0308139 A1 Sep. 29, 2022

(30) Foreign Application Priority Data

Mar. 29, 2021 (EP) ..................................... 21165607
Jun. 30, 2021 (EP) ..................................... 21182676

(51) Int. Cl.
| | | |
|---|---|---|
| G01R 33/38 | (2006.01) | |
| G01R 33/34 | (2006.01) | |
| G01R 33/3815 | (2006.01) | |
| G01R 33/383 | (2006.01) | |
| G01R 33/385 | (2006.01) | |
| G01R 33/421 | (2006.01) | |
| G01R 33/483 | (2006.01) | |
| G01R 33/56 | (2006.01) | |

(52) U.S. Cl.
CPC ......... *G01R 33/3806* (2013.01); *G01R 33/34* (2013.01); *G01R 33/34023* (2013.01); *G01R 33/3815* (2013.01); *G01R 33/383* (2013.01); *G01R 33/385* (2013.01); *G01R 33/4215* (2013.01); *G01R 33/4835* (2013.01); *G01R 33/56* (2013.01)

(58) Field of Classification Search
CPC ................ G01R 33/3806; G01R 33/34; G01R 33/34023; G01R 33/3815; G01R 33/383; G01R 33/385; G01R 33/4215; G01R 33/4835; G01R 33/56; G01R 33/3808; A61B 5/055

See application file for complete search history.

(56) References Cited

U.S. PATENT DOCUMENTS

| | | |
|---|---|---|
| 4,818,966 A | 4/1989 | Miyamoto et al. |
| 5,304,930 A | 4/1994 | Crowley et al. |
| 5,307,039 A | 4/1994 | Chari et al. |

(Continued)

FOREIGN PATENT DOCUMENTS

| | | |
|---|---|---|
| CN | 205514601 U | 8/2016 |
| EP | 0284439 B1 | 2/1993 |

*Primary Examiner* — G. M. A Hyder
(74) *Attorney, Agent, or Firm* — Banner & Witcoff Ltd.

(57) ABSTRACT

A magnetic resonance imaging device may include a field generator configured to provide a magnetic field in an imaging volume of the magnetic resonance imaging device. The field generator may include at least one magnet that confines the imaging volume in at least one spatial direction. The at least one magnet may be curved in such a way that a perpendicular distance between a line oriented along a direction of access to the imaging volume and a surface directed towards the imaging volume of the at least one magnet varies in the direction of access to the imaging volume.

19 Claims, 7 Drawing Sheets

(56) References Cited

U.S. PATENT DOCUMENTS

Figure 1:
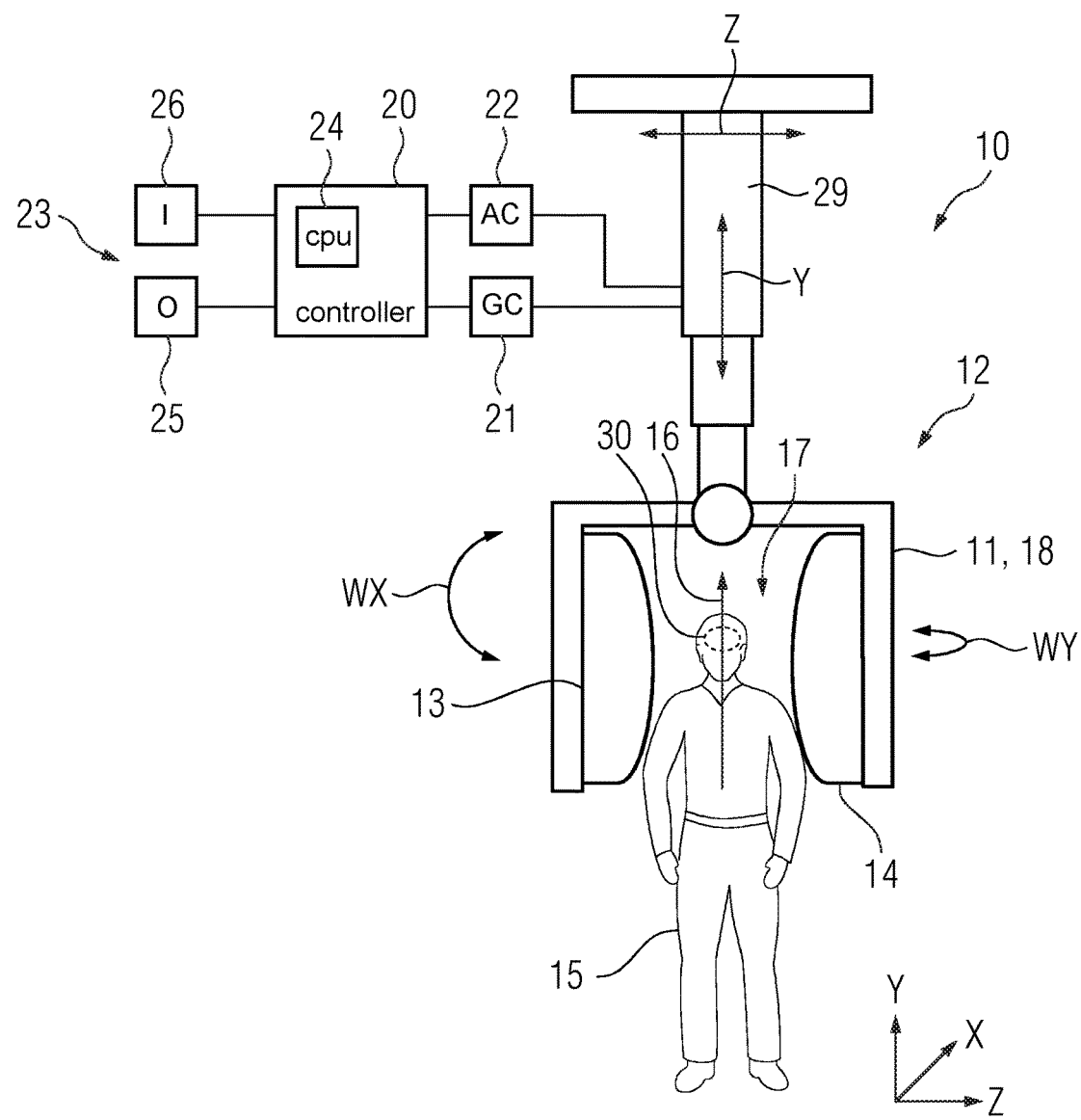

| | | | |
|---|---|---|---|
| 6,707,363 B1* | 3/2004 | Abele | G01R 33/383 |
| | | | 324/319 |
| 2002/0050820 A1* | 5/2002 | Overweg | G01R 33/3806 |
| | | | 324/309 |
| 2005/0198812 A1* | 9/2005 | Schuster | H01F 41/041 |
| | | | 29/606 |
| 2006/0055406 A1 | 3/2006 | Lvovsky et al. | |
| 2015/0038830 A1 | 2/2015 | Blasche et al. | |
| 2021/0341556 A1* | 11/2021 | Mallett | G01R 33/383 |
| 2022/0308142 A1* | 9/2022 | Mallett | G01R 33/4215 |

* cited by examiner

MAGNETIC RESONANCE IMAGING DEVICE WITH A CURVED FIELD GENERATION UNIT

CROSS REFERENCE TO RELATED APPLICATIONS

This patent application claims priority to European Patent Application No. 21165607.9, filed Mar. 29, 2021, and European Patent Application No. 21182676.3, filed Jun. 30, 2021, each of which is incorporated herein by reference in its entirety.

BACKGROUND

Field

The disclosure relates to a magnetic resonance imaging device comprising a field generator including at least one magnet, wherein the field generator is configured to provide a magnetic field in an imaging volume of the magnetic resonance imaging device.

Related Art

Magnetic resonance tomography represents a prominent imaging method for acquiring images of an interior of the examination object. For carrying out a magnetic resonance measurement, the examination object is usually positioned in a strong and homogeneous static magnetic field (B0 field) of a magnetic resonance imaging device. The static magnetic field may comprise magnetic field strengths of 0.2 Tesla to 7 Tesla, thus aligning nuclear spins inside the examination object along the static magnetic field. For triggering so-called nuclear spin resonances, radiofrequency excitation pulses are emitted into the examination subject. Each radiofrequency excitation pulse causes a magnetization of nuclear spins within the examination object to deviate from the static magnetic field by an amount which is known as the flip angle. A radiofrequency excitation pulse may comprise an alternating (electro-)magnetic field with a frequency which corresponds to the Larmor frequency at the respective static magnetic field strength. Excited nuclear spins may exhibit a rotating and decaying magnetization (nuclear magnetic resonance), which can be detected using dedicated radiofrequency antennas. For spatial encoding of measured data, rapidly switched magnetic gradient fields are superimposed on the static magnetic field.

The received nuclear magnetic resonances are typically digitized and stored as complex values in a k-space matrix. This k-space matrix can be used as a basis for a reconstruction of magnetic resonance images and for determining spectroscopic data. A magnetic resonance image is typically reconstructed by means of a multi-dimensional Fourier transformation of the k-space matrix.

During an imaging examination, the patient is typically enclosed in a bore (e. g. in solenoid scanners) or between a pair of magnets (e. g. in C-type scanners) of the magnetic resonance imaging device. Due to spatial restrictions within the bore or a space between the pair of magnets, magnetic resonance imaging provides limited use for surgical procedures or biopsies. As the patient typically needs to be positioned inside the magnetic resonance imaging device, a size of the bore as well as other dimensions of the magnetic resonance imaging device are dictated by the size of the human body. From a cost and/or space utilization perspective, this may be unsatisfactory, especially if the examination is restricted to a body region of the patient, which is significantly smaller than an imaging volume provided by the magnetic resonance imaging device. Furthermore, patients with a claustrophobic condition or children may not tolerate elongated examination times usually associated with a magnetic resonance measurement.

In addition, a field generation of the magnetic resonance imaging device must be built to ensure a fixed relative position of included magnets, e. g. to counteract occurring magnetic forces. As differently sized patients have to fit inside the magnetic resonance imaging device without physically interfering with any hardware components, the magnets are usually positioned in quite a distance to an imaging volume of the magnetic resonance imaging device. This may decrease an efficiency of the field generator—e. g. characterized by a ratio of a volume of required magnetic material and a usable magnet field strength in the imaging volume—as well as an efficiency of electric and/or cooling infrastructure of the magnetic resonance imaging device. Even dedicated scanners adapted to specific body regions of a patient may encounter this problem, when conventional solenoidal or C-type scanners are used.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 2:
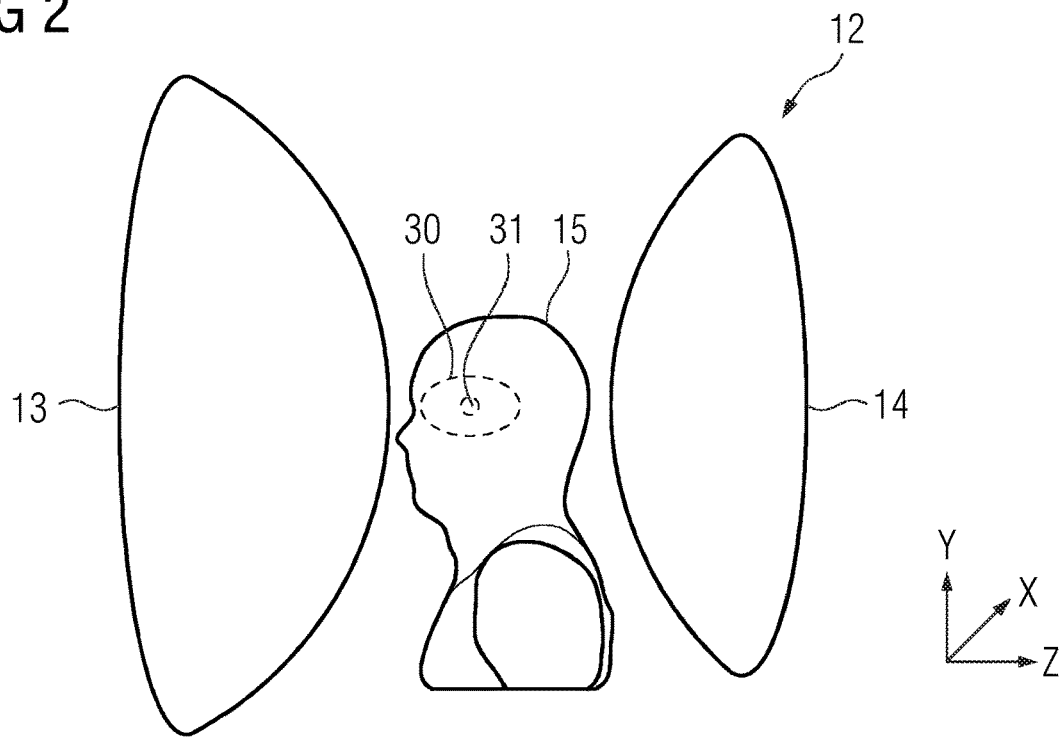
Figure 3:
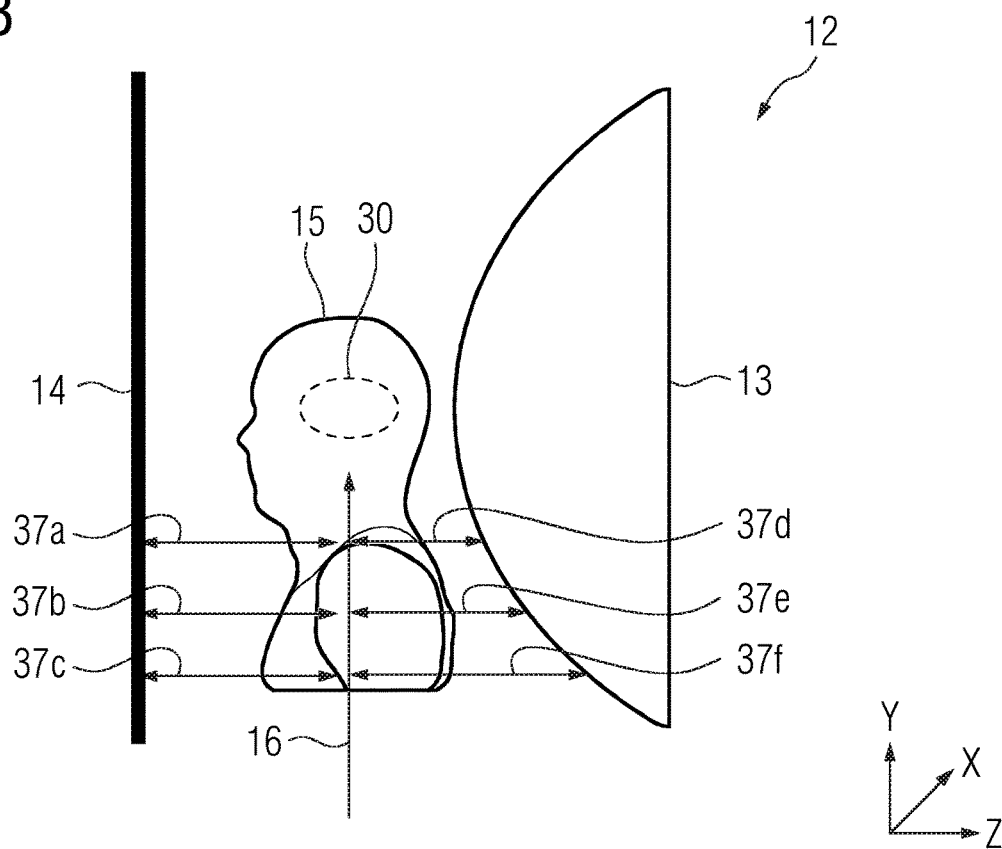
Figure 4:
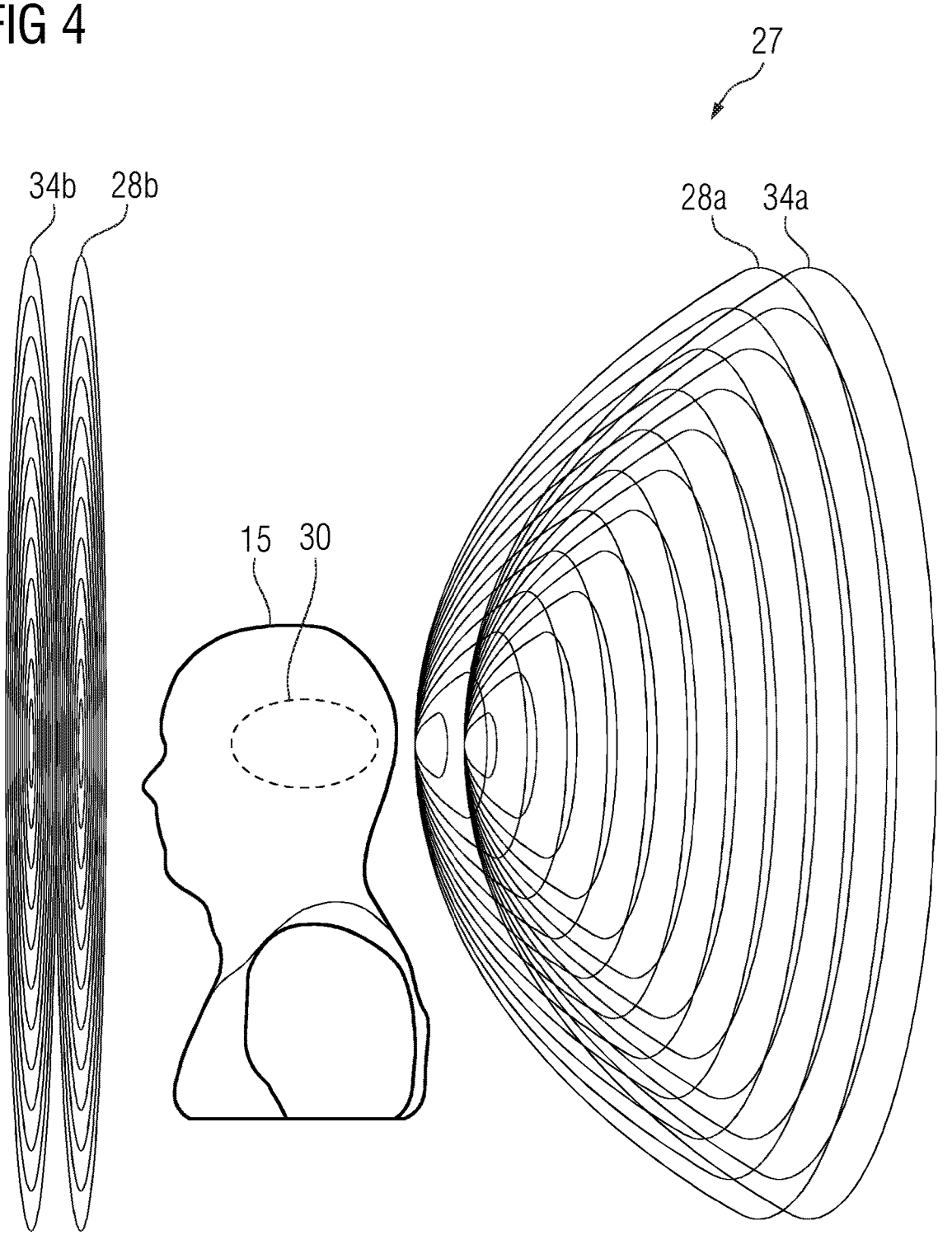
Figure 5:
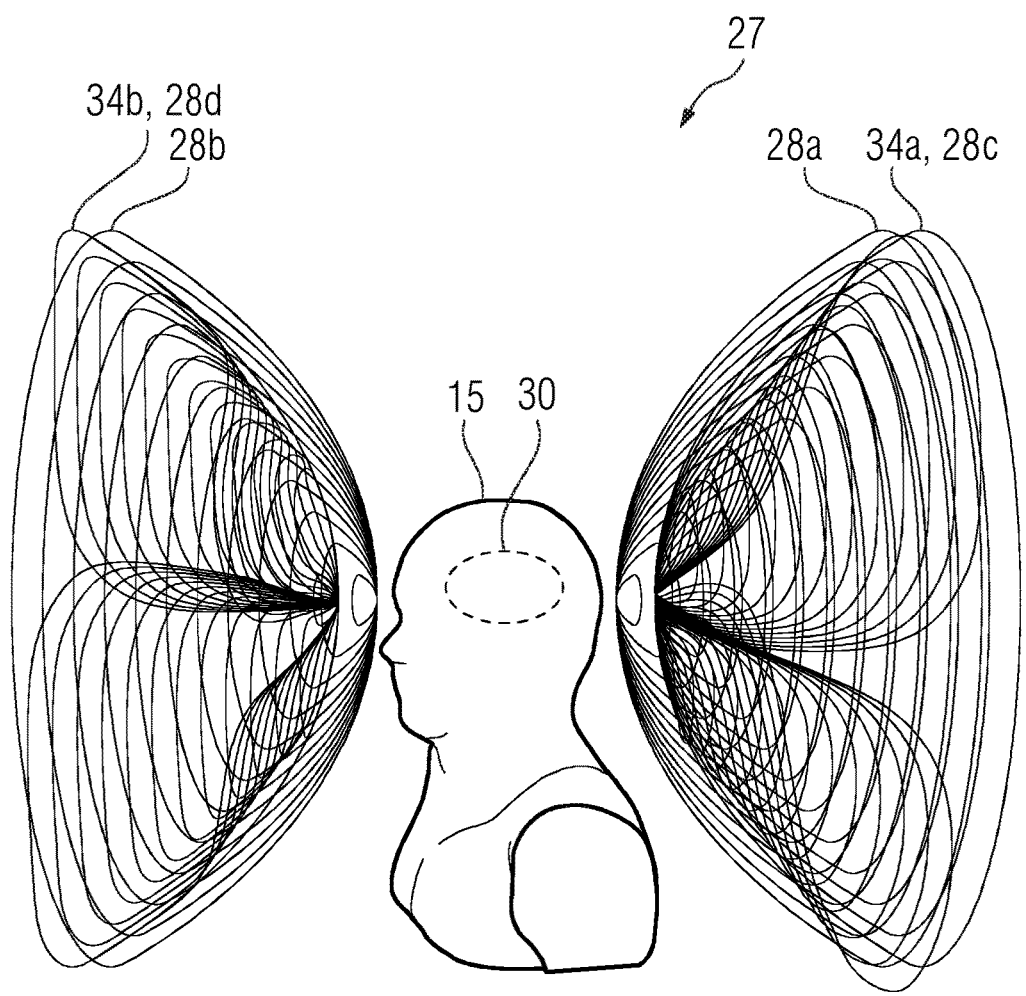
Figure 6:
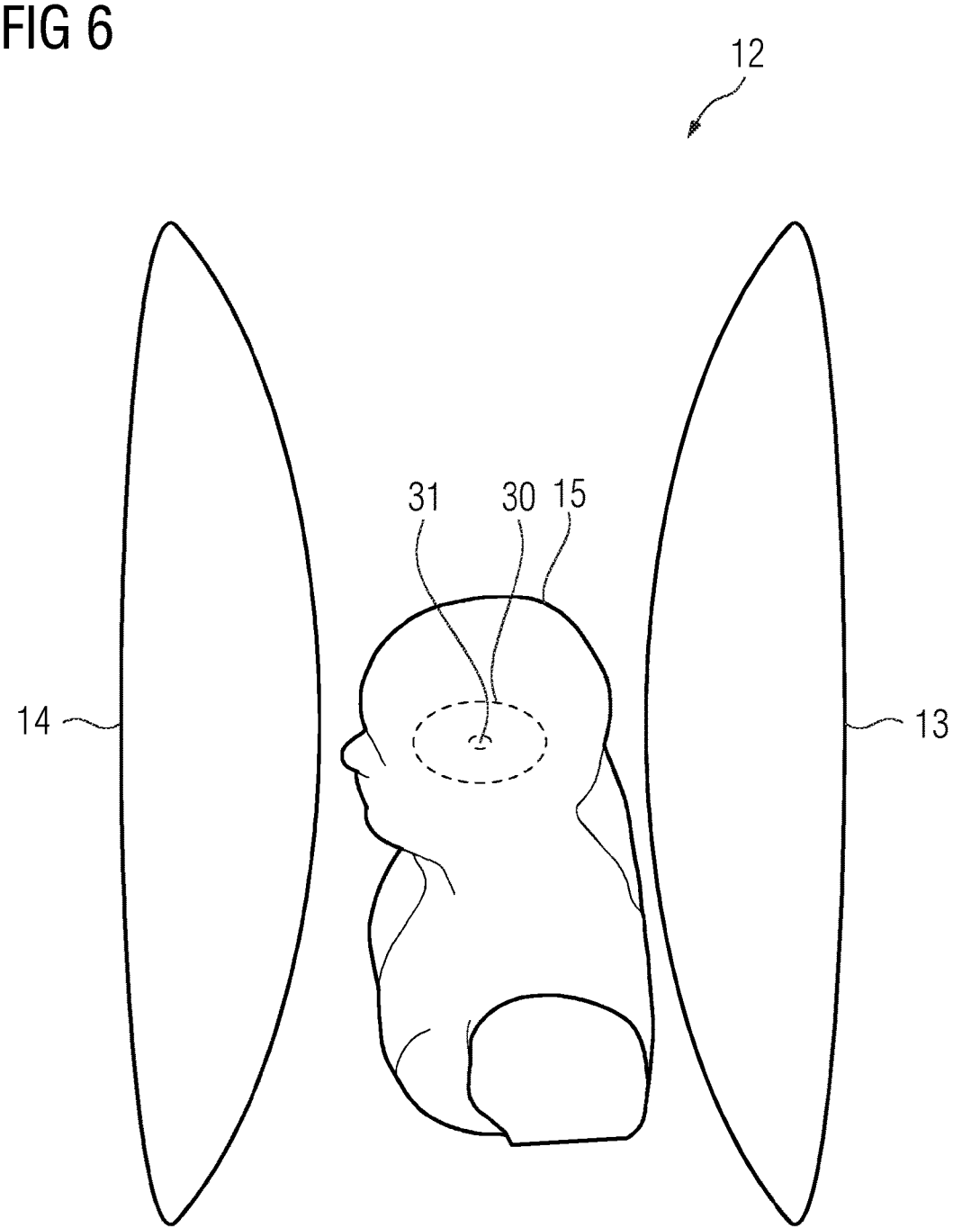
Figure 7:
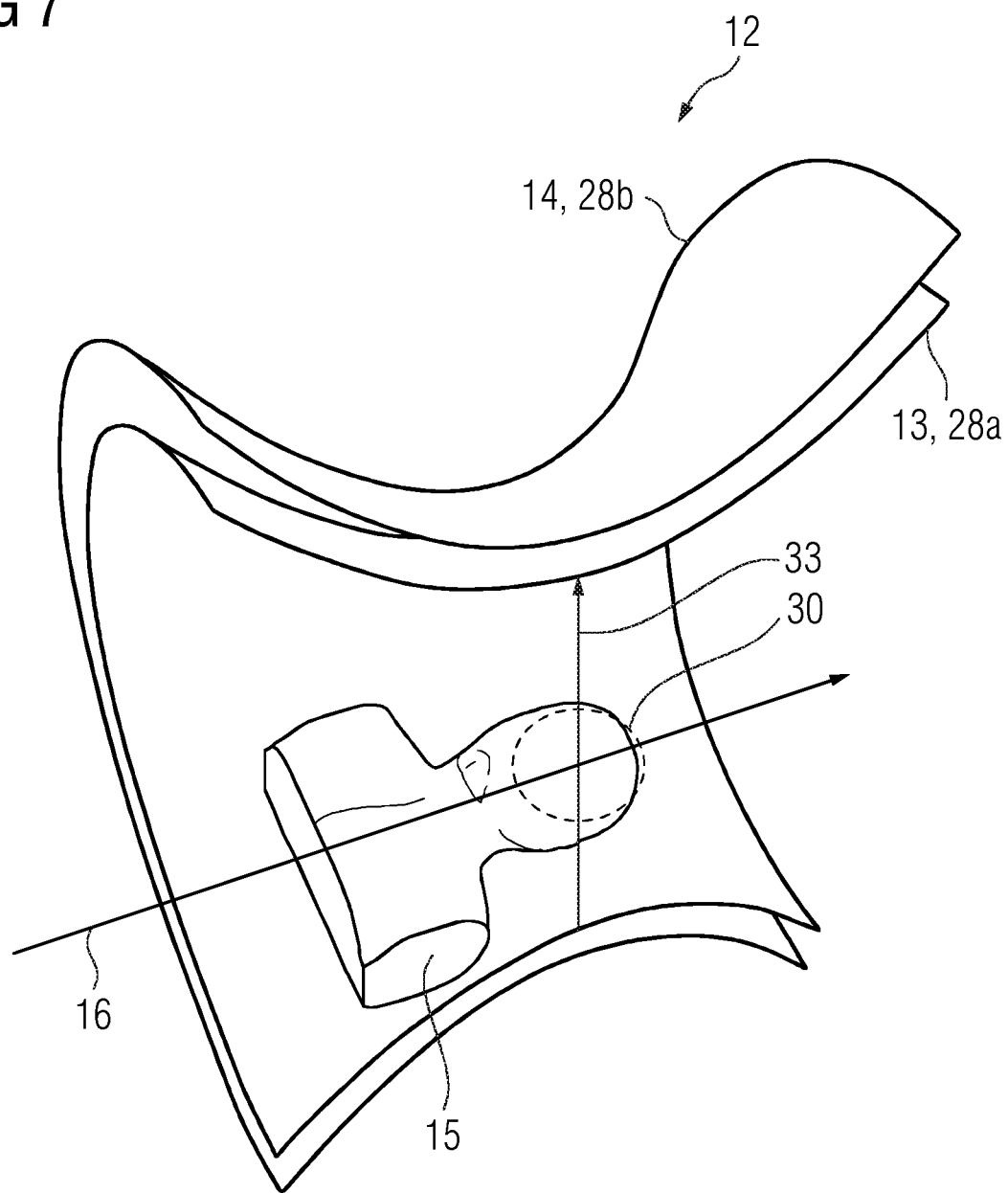
Figure 8:
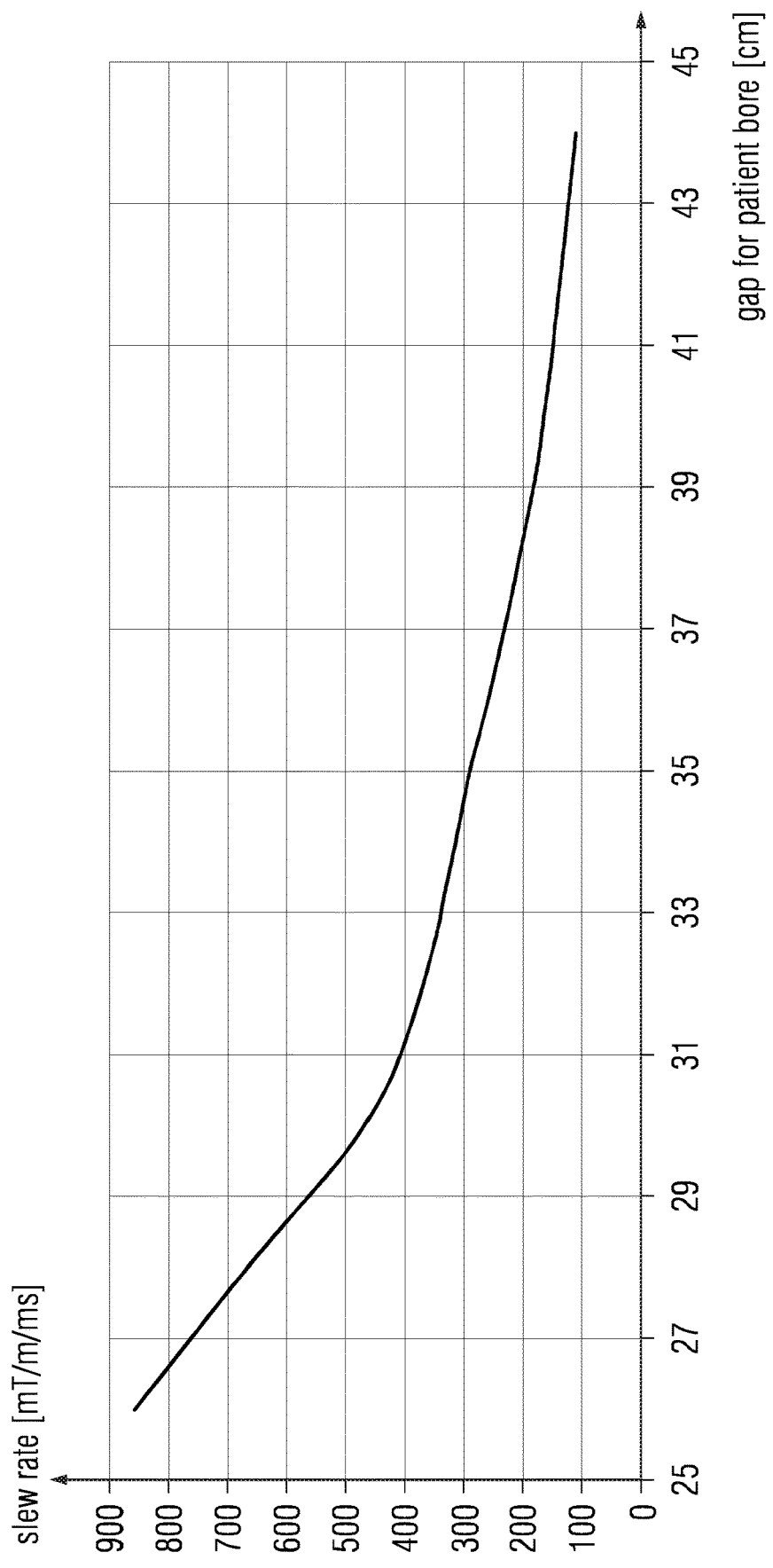

FIG. 1 a schematic representation of an embodiment of an inventive magnetic resonance imaging device, FIG. 2 a schematic representation of an embodiment of an inventive magnetic resonance imaging device, FIG. 3 a schematic representation of an embodiment of an inventive magnetic resonance imaging device, FIG. 4 a schematic representation of an embodiment of an inventive magnetic resonance imaging device, FIG. 5 a schematic representation of an embodiment of an inventive magnetic resonance imaging device, FIG. 6 a schematic representation of an embodiment of an inventive magnetic resonance imaging device, FIG. 7 a schematic representation of an embodiment of an inventive magnetic resonance imaging device, FIG. 8 a representation of a relationship between a slew rate of an inventive field generator and a gap of a bore of an inventive magnetic resonance imaging device.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

It is therefore an object of the disclosure to increase an efficiency of a field generator of a magnetic resonance imaging device.

This object is achieved by a magnetic resonance imaging device according to the disclosure.

The inventive magnetic resonance imaging device comprises a field generator configured to provide a magnetic field in an imaging volume of the magnetic resonance imaging device, wherein the field generator comprises at least one magnet, wherein the at least one magnet confines the imaging volume in at least one spatial direction.

A field generator may comprise a plurality of magnets required for performing a magnetic resonance measurement. For example, the field generator may comprise at least one magnet configured to generate a static magnetic field inside an imaging volume of the magnetic resonance imaging device. A static magnetic field may be a B0-field of the magnetic resonance imaging device comprising either an essentially homogeneous magnet field or a predetermined magnetic gradient field. In a further example, the field generator comprises at least one gradient coil for generating a temporary magnetic gradient field inside the imaging volume. It is also conceivable, that the field generator includes at least one radiofrequency antenna for emitting radiofrequency excitation pulses in a power and frequency range of a magnetic resonance measurement into an image acquisition region of the magnetic resonance imaging device. The at least one radiofrequency antenna may also be configured to receive magnetic resonance signals (nuclear magnetic resonance) from the image acquisition region.

An imaging volume may be characterized by a predefined magnetic field direction and/or magnetic field strength. For example, the imaging volume may comprise a volume with a substantially uniform magnetic field direction and/or a uniform magnetic field strength. Such a volume may be an isocenter of the magnetic resonance imaging device. It is also conceivable, that the imaging volume comprises a predefined magnetic gradient field. Such a magnetic gradient field may be used for spatial encoding of magnetic resonance signals acquired from an examination object positioned within the imaging volume.

The at least one magnet may confine the imaging volume in at least one spatial direction in such a way, that accessing or entering the imaging volume from a direction substantially corresponding to the at least one spatial direction is impractical or impossible. For example, the at least one magnet may bar or block an access to the imaging volume in any direction essentially coinciding with the at least one direction.

The at least one magnet is curved in such a way, that a perpendicular distance between a line oriented along a direction of access to the imaging volume and a surface directed towards the imaging volume of the at least one magnet varies in the direction of access to the imaging volume.

The at least one magnet may be configured as a main magnet for generating a static magnetic field inside the imaging volume. However, the at least one magnet may also correspond to a gradient coil, a set of gradient coils and/or a radiofrequency antenna of the magnetic resonance imaging device. In one example, the at least one magnet is curved in such a way, that the surface directed towards the imaging volume of the at least one magnet comprises a non-planar shape. In an exemplary embodiment, the surface directed towards the imaging volume of the at least one magnet comprises the shape of a cone or a frustum. However, other shapes, such as a hemisphere, or any complex three-dimensional shape tapering in a direction towards the imaging volume is also conceivable. In providing at least one magnet with a curved surface directed towards the imaging volume or tapering in a direction towards the imaging volume, a clearance may favorably be provided for accommodating body region of a patient. For example, a conically shaped surface directed towards the imaging volume of the at least one magnet may favorably accommodate for a shoulder or an abdominal area of a patient when positioning an eye region, a jaw region or a heart of the patient inside the imaging volume.

The direction of access to the imaging volume may be characterized by a substantially straight line leading from an environment or an arbitrary point within an examination room to the imaging volume. The line is oriented along the direction of access to the imaging volume. In an exemplary embodiment, a trajectory defined by the line is unobstructed by components of the magnetic resonance imaging device. The direction of access relates to a trajectory along which a patient can enter the imaging volume.

A perpendicular distance between the line and the surface directed towards the imaging volume of the at least one magnet may vary along the direction of access to the imaging volume in such a way, that the perpendicular distance decreases in a direction towards the imaging volume. For example, the perpendicular distance between the line and the surface directed towards the imaging volume of the at least one magnet may decrease in a linear, a non-linear, a hyperbolical, a parabolical, an exponential or a similar fashion in the direction of the imaging volume. A perpendicular distance may be interpreted as a distance between an arbitrarily chosen point on the line and a nearest point on the surface directed towards the imaging volume of the at least one magnet. Particularly, the perpendicular distance may be characterized by a length of a normal vector of the line connecting the arbitrarily chosen point on the line and the nearest point on the surface directed towards the imaging volume of the at least one magnet.

In providing at least one magnet with a curved surface directed towards the imaging volume, a mean distance between a center of the imaging volume and the at least one magnet may be reduced while still providing sufficient clearance for accommodating a body and/or a body region of a patient inside the image acquisition region of the magnetic resonance imaging device. Thus, an efficiency of the field generator may favorably be increased in comparison to conventional solenoid and/or C-type magnetic resonance imaging devices with a comparable magnetic field strength.

According to another embodiment of the inventive magnetic resonance imaging device the field generator comprises a second magnet, wherein the at least one magnet and the second magnet are arranged in such a way to provide an access to the imaging volume along at least two perpendicular spatial directions.

For example, the at least one magnet may confine the imaging volume in a first spatial direction and the second magnet may confine the imaging volume in a second spatial direction which is different from the first spatial direction. The first spatial direction and the second spatial direction may be oriented in parallel. Particularly, the first spatial direction and the second spatial direction may be oriented in opposite directions at an angle of 180°. However, the two spatial directions may also be oriented at an angle below 180° or above 180°. The at least one magnet and the second magnet may be carried and/or kept apart by a supporting structure of the magnetic resonance imaging device and the imaging volume may be positioned in a free volume or gap between the at least one magnet and the second magnet. It is conceivable, that an access to the imaging volume is provided along any unobstructed line connecting an arbitrarily chosen position in the examination room with the center of the imaging volume. The examination room may be a room wherein the magnet resonance imaging device is positioned and/or wherein a magnetic resonance measurement may be performed.

The at least one magnet and/or the second magnet may comprise an axis of rotational symmetry. In one embodiment, a first direction of access to the imaging volume may be oriented essentially perpendicular to an axis of rotational symmetry of the at least one magnet and/or the second magnet. A second direction of access may be oriented essentially perpendicular to the first direction of access and the axis of rotational symmetry of the at least one magnet and/or the second magnet. However, the first direction of access and/or the second direction of access may also comprise an angle with respect to the axis of rotational symmetry of the at least one magnet and/or the second magnet. An axis of rotational symmetry may be characterized in that the at least one magnet and/or the second magnet look the same after turning the at least one magnet and/or the second magnet around the axis of rotational symmetry at least a part of a turn. It is also conceivable, that the at least one magnet and/or the second magnet comprise a discrete rotational symmetry of a higher order of n>1. This may signify, that a rotation of the at least one magnet and/or the second magnet about the axis of rotational symmetry by an angle of 360°/n does not change the at least one magnet and/or the second magnet.

In an exemplary embodiment, the imaging volume may be accessed via a plurality of directions of access. In one embodiment, the imaging volume is accessible via at least two essentially perpendicular spatial directions. However, the imaging volume may also be accessible via three essentially perpendicular spatial directions. The three perpendicular spatial directions may correspond to the axes of a cartesian coordinate system, an origin of the cartesian coordinate system being positioned in the center of the imaging volume.

The direction of access to the imaging volume along each of the at least two perpendicular spatial directions is angled with respect to a main direction of magnetic field lines within the imaging volume.

In an exemplary embodiment, an angle between each of the at least two perpendicular spatial directions and the main direction of magnetic field lines within the imaging volume is a non-zero angle. For example, the angle between each of the at least two perpendicular spatial directions and the main direction of magnetic field lines within the imaging volume may comprise a value in the range of 1° to 180°, 10° to 170° or 30° to 150°. However, any angle differing from a substantially parallel orientation with respect to the main direction of magnetic field lines within the imaging volume is conceivable.

In one embodiment, the at least one magnet and the second magnet may be separated by a shield coil. The shield coil may be configured to shield the at least one magnet and/or the second magnet from electromagnetic interference and/or magnetic fields provided by other magnets (e. g. the at least one magnet may be shielded from the second magnet and/or electromagnetic interference in an environment). For example, the shield coil may be positioned adjacent to the surface directed away from the imaging volume of the at least one magnet. However, the shield coil may also be positioned adjacent to a surface directed towards the imaging volume of the at least one magnet. In an exemplary embodiment, the at least one magnet comprises a first shield coil positioned adjacent to the at least one magnet. Likewise, the second magnet may comprise a second shield coil positioned adjacent to the second magnet.

In arranging the at least one magnet and the second magnet in such a way to provide an access to the imaging volume along at least two perpendicular spatial directions, an accessibility of the imaging volume may favorably be enhanced while maintaining or decreasing a distance between the at least one magnet and/or the second magnet and the imaging volume. Thus, a better compromise between the efficiency of the field generator and the accessibility of the imaging volume may advantageously be provided in comparison to conventional magnetic resonance imaging devices.

According to a further embodiment of the inventive magnetic resonance imaging device, a surface directed towards the imaging volume of the second magnet is curved in such a way, that a perpendicular distance between the line oriented along the direction of access to the imaging volume and the surface directed towards the imaging volume of the second magnet varies in the direction of access to the imaging volume.

The curvature of the surface directed towards the imaging volume of the second magnet may correspond to the curvature of the at least one magnet directed towards the imaging volume. For example, the at least one magnet and the second magnet may be arranged symmetrically with respect to the imaging volume. In this case, a first distance between the center of the imaging volume and a nearest point on the surface of the at least one magnet may correspond to a second distance between the center of the imaging volume and a nearest point on the surface of the second magnet. It is also conceivable, that the at least one magnet and the second magnet are arranged symmetrically with respect to a symmetry plane running through the center of the imaging volume. In this embodiment, a shape of the at least one magnet may essentially correspond to a shape of the second magnet. However, the at least one magnet and the second magnet may also comprise different shapes. For example, the curvature of the surface directed towards the imaging volume of the at least one magnet may comprise a different shape, slope and/or surface area than the surface directed towards the imaging volume of the second magnet. Particularly, the at least one magnet and the second may be arranged asymmetrically with respect to the imaging volume. In one embodiment, the first distance may differ from the second distance. It is conceivable, that the at least one magnet and the second magnet confine the imaging volume from two opposing sides.

In providing a second magnet with a curved surface directed towards the imaging volume, an image acquisition region of the magnetic resonance imaging device may favorably be adapted to better accommodate a patient and/or match a contour of a body region of the patient (such as a belly, a shoulder and/or a neck of the patient) from more than one side. Thus, dedicated scanners with a high efficiency of the field generator and increased patient comfort can be provided.

In a further embodiment of the magnetic resonance imaging device, a surface directed towards the imaging volume of the second magnet is shaped in such a way, that a perpendicular distance between the line oriented along the direction of access to the imaging volume and the surface directed towards the imaging volume of the second magnet is constant in the direction of access to the imaging volume.

For example, the surface directed towards the imaging volume of the second magnet may be essentially flat or planar. In this case the direction of access to the imaging volume may be oriented in parallel to the flat or planar surface of the second magnet. It is conceivable, that a second surface area of the surface directed towards the imaging volume of the second magnet differs from a first surface area of the surface directed towards the imaging volume of the at least one magnet. The second surface area may exceed the first surface area or be smaller than the first surface area. However, it is also conceivable that the first surface area essentially matches the second surface area.

In providing a second magnet with an essentially planar or flat surface directed towards the imaging volume, manufacturing costs of the field generator may favorably be decreased while still providing at least one magnet with a curved surface directed towards the imaging volume for increasing the efficiency of the field generator. In one example, the flat or planar surface directed towards the imaging volume of the second magnet may favorably be used to accommodate a back of the patient, which typically features a topology which is more level or even than a front side of the patient.

In a further embodiment of the inventive magnetic resonance imaging device, the at least one magnet and/or the second magnet are configured to generate a static magnetic field in the imaging volume, wherein the static magnetic field is homogenous throughout the imaging volume or wherein the static magnetic field comprises a predefined magnetic field gradient across the imaging volume.

The at least one magnet and/or the second magnet may represent main magnets of the field generator configured to provide a B0 magnetic field. It is conceivable, that the B0 magnetic field provided via the at least one magnet and/or the second magnet is a static magnetic field with particularly high magnetic homogeneity. However, the B0 magnetic field provided via the at least one magnet may also comprise a predefined magnetic field gradient. This predefined magnetic field gradient may be used for spatial encoding of magnetic resonance signals acquired from the image acquisition region.

In an embodiment, the at least one magnet and the second magnet are arranged on two opposing sides of the imaging volume and represent two magnetic poles or segments of a combined magnet for providing a homogenous B0 magnetic field. For this purpose, the magnetic field strengths of the at least one magnet and the second magnet may substantially coincide. However, the magnetic field strengths of the at least one magnet and the second magnet may also differ, thus providing the predefined magnetic field gradient across the imaging volume. It is also conceivable, that the at least one magnet is configured as a solenoid circumferentially enclosing the imaging volume. In this case, a second magnet may be omitted.

In providing at least one magnet with a curved surface directed towards the imaging volume for generating a B0 magnetic field, a major component of the field generator may be shaped in such a way to better accommodate a specific body region of the patient and/or increase the efficiency of the magnetic resonance imaging device. Furthermore, the curved surface directed towards the imaging volume of the at least one magnet may enhance bundling of magnetic field lines within the imaging volume, thus providing stronger magnetic gradient fields.

In an exemplary embodiment, the at least one magnet comprises a set of gradient coils, wherein the set of gradient coils is configured to generate a magnetic gradient field in the imaging volume.

The at least one magnet be configured as a gradient magnet comprising a set of gradient coils. A set of gradient coils may comprise one or more gradient coils. For example, the set of gradient coils may comprise one, two, three or more gradient coils. The gradient coils may consist of wires coiled in such a way to provide an essentially planar shape, a curved shape or a tubular shape. An axial cross-section of a tubular gradient coil may be circular, oval or polygonal. In one embodiment, the set of gradient coils of the at least one magnet may comprise one gradient coil, circumferentially enclosing the imaging volume along the direction of access to the imaging volume. The gradient coil may be configured as a tubular solenoid and a diameter of the tubular solenoid may vary along the direction of access to the imaging volume.

However, the set of gradient coils may also comprise at least two gradient coils, positioned on opposite sides of the imaging volume. The set of gradient coils may be positioned in such a way, that the direction of access to the imaging volume is oriented essentially perpendicular to an axis of rotational symmetry of the set of gradient coils. It is also conceivable, that the set of gradient coils is positioned on one side of the imaging volume. For example, a first gradient coil and a second gradient coil of the set of gradient coils may be positioned adjacent to one another and confine the imaging volume in essentially one spatial direction.

In a further embodiment of the inventive magnetic resonance imaging device, the field generator comprises a second magnet, wherein the second magnet comprises a second set of gradient coils.

The second set of gradient coils may comprise one or more gradient coils. The second set of gradient coils may be arranged along an axis of rotational symmetry of the at least one magnet and/or the second magnet. Particularly, an axis of rotational symmetry of the second set of gradient coils may coincide with the axis of rotational symmetry of the at least one magnet. In one embodiment, the axis of rotational symmetry of the at least one magnet coincides with a direction of access to the imaging volume. However, according to another embodiment, the axis of rotational symmetry of the at least one magnet is oriented essentially orthogonal to the direction of access to the imaging volume. In the latter case, the set of gradient coils and the second set of gradient coils may be positioned on opposing sides of the imaging volume. However, it is also conceivable, that a first gradient coil and a second gradient coil of the at least one magnet are positioned on opposing sides of the imaging volume and that a first gradient coil and a second gradient coil of the second magnet are positioned on opposing sides of the imaging volume. The first gradient coil of the at least one magnet may be positioned adjacent to the first gradient coil of the second magnet and/or the second gradient coil of the second magnet.

The second set of gradient coils is configured to generate a second magnetic gradient field in the imaging volume, wherein the second magnetic gradient field is oriented perpendicular to the magnetic gradient field provided via the at least one magnet.

In a further embodiment, the field generator of the inventive magnetic resonance imaging device comprises a third magnet, wherein the third magnet comprises a third set of gradient coils and wherein the third set of gradient coils is configured to generate a third magnetic gradient field in the imaging volume, wherein the third magnetic gradient field is oriented perpendicular to the magnetic gradient field provided via the at least one magnet. It is also conceivable, that the gradient fields of the first magnet, the second magnet and the third magnet are oriented essentially perpendicular to one another. In an exemplary embodiment, the third magnet comprises a curved surfaced similar or different to the curved surface of the first magnet and/or the second magnet.

In providing a set of gradient coils with a curved surface according to the disclosure, an efficiency of a gradient system can favorably be improved in comparison to conventional magnetic resonance imaging devices. A possible advantage of the enhanced efficiency of the gradient system may be an increased slew rate of a gradient coil or a set of gradient coils in comparison to conventional magnet resonance imaging devices.

In a further embodiment of the magnetic resonance imaging device, the second magnet is curved in such a way, that a perpendicular distance between the line oriented along the direction of access to the imaging volume and the surface directed towards the imaging volume of the second magnet varies in the direction of access to the imaging volume, wherein a curvature of the second magnet is different from a curvature of the at least one magnet.

As described above, the at least one magnet and/or the second magnet may represent a main magnet or a gradient magnet of the magnetic resonance imaging device. The curvature of the surface directed towards the imaging volume of the second magnet differs from the curvature of the surface directed towards the imaging volume of the at least one magnet. For example, the curvature of the surface directed towards the imaging volume of the at least one magnet may comprise a different shape, slope and/or surface area than the surface directed towards the imaging volume of the second magnet. The at least one magnet and the second magnet may be positioned adjacent to one another. In this case, the at least one magnet and the second magnet may favorably be arranged in such a way to facilitate an access of a specific body region of the patient to the imaging volume and/or accommodate the specific body region of the patient positioned within the imaging volume. In an alternative embodiment, the at least one magnet and the second magnet confine the imaging volume in substantially two opposing spatial directions.

The different curvatures of the surfaces directed towards the imaging volume of the at least one magnet and the second magnet may favorably enable reducing a distance between at least a part of the at least one magnet and the imaging volume and/or at least a part of the second magnet and the imaging volume, thus increasing the efficiency of the field generator.

In an alternative embodiment, the surface directed towards the imaging volume of the second magnet is shaped in such a way, that the perpendicular distance between the line oriented along the direction of access to the imaging volume and the surface directed towards the imaging volume of the second magnet is constant in the direction of access to the imaging volume.

For example, the surface directed towards the imaging volume of the second magnet may be substantially planar or flat. It is also conceivable, that the surface directed towards the imaging volume of the second magnet is oriented in parallel to the direction of access to the imaging volume. Furthermore, the at least one magnet and the second magnet may be positioned adjacent to one another. Thus, a particularly compact or space-efficient arrangement of the at least one magnet and the second magnet may favorably be provided. In this case, the at least one magnet preferably is positioned closer to the imaging volume than the second magnet. However, the at least one magnet and the second magnet may also be arranged in such a way, that the imaging volume is confined by the at least one magnet and the second magnet in essentially two opposite spatial directions.

In providing a second magnet with a substantially flat or planar surface directed towards the imaging volume, manufacturing costs and/or an effort for assembly of the field generator may favorably be reduced while still enabling the at least one magnet to be positioned in proximity to the imaging volume. Thus, a cost-to-efficiency ratio of the magnetic resonance imaging device may favorably be adapted according to a requirement of a specific body region of a patient.

In one embodiment of the inventive magnetic resonance imaging device, the at least one magnet is configured to enclose at least a part of the imaging volume along at least a part of the line oriented along the direction of access to the imaging volume, wherein the direction of access to the imaging volume is oriented in parallel to a main direction of magnetic field lines within the imaging volume.

The at least one magnet may represent a main magnet or a gradient magnet comprising a set of gradient coils. The at least one magnet may enclose at least a part of a surface of an imaginary cylinder whose axis of rotational symmetry coincides with the line oriented along the direction of access to the imaging volume. Particularly, the at least one magnet may enclose an arc of the imaginary cylinder along the direction of the imaging volume. For example, an angle defining the arc may exceed 60°, 90°, 120°, 150° or 180°.

In an exemplary embodiment, the at least one magnet is shaped in such a way, that a minimum perpendicular distance between the line oriented along the direction of access to the imaging volume and the surface directed towards the imaging volume of the at least one magnet is located at a center of the imaging volume. For example, a first perpendicular distance between the line oriented along the direction of access to the imaging volume and the surface directed towards the imaging volume of the at least one magnet is located at a first distance from the imaging volume and a second perpendicular distance between the line oriented along the direction of access to the imaging volume and the surface directed towards the imaging volume of the at least one magnet is located at a second distance from the imaging volume. The at least one magnet may be curved in such a way, that the first perpendicular distance exceeds the second perpendicular distance and the first distance exceeds the second distance. It is also conceivable, that the perpendicular distance between the line oriented along the direction of access to the imaging volume and the surface directed towards the imaging volume of the at least one magnet increases in a direction facing away from the center of the imaging volume along the line oriented along the direction of access to the imaging volume. An overall shape of the at least one magnet may essentially correspond to an hourglass, a double-cone, a double-frustum or the like.

According to one embodiment of the inventive magnetic resonance imaging device, the field generator comprises a second magnet, wherein the second magnet is configured to enclose at least a part of the imaging volume along at least a part of the line oriented along the direction of access to the imaging volume, wherein the second magnet is curved in such a way, that a perpendicular distance between the line oriented along the direction of access to the imaging volume and the surface directed towards the imaging volume of the second magnet varies in the direction of access to the imaging volume.

A slope of the curvature of the surface directed towards the imaging volume of the second magnet may correspond to a slope of the curvature of the surface directed towards the imaging volume of the at least one magnet at one or more cross-sections of the field generator along the direction of access to the imaging volume. However, the slopes of the curvatures of the at least one magnet and the second magnet may also differ at one or more cross-sections of the field generator along the direction of access to the imaging volume. In an exemplary embodiment, the at least one magnet and the second magnet comprise equal shapes but different dimensions. For example, a diameter and/or a length of the at least one magnet may differ from a diameter and/or a length of the second magnet. However, the second magnet may also be shaped differently than the second magnet.

Analogous to the at least one magnet, the second magnet may represent a main magnet or a gradient magnet comprising a second set of gradient coils. The second magnet may enclose at least a part of the surface area of the imaginary cylinder whose axis of rotational symmetry coincides with the line oriented along the direction of access to the imaging volume. Particularly, the second magnet may enclose at least an arc of the imaginary cylinder along the direction of the imaging volume. For example, an angle defining the arc may exceed 60°, 90°, 120°, 150° or 180°.

In providing a magnet enclosing at least a part of the imaging volume along at least a part of the line oriented along the direction of access to the imaging volume, an enclosure of the imaging volume with magnetic material may favorably be enhanced. Thus, a homogeneity and/or a magnetic field strength within the imaging volume may be increased in comparison to conventional C-type or dipole magnetic resonance imaging devices.

In an exemplary embodiment, the at least one magnet and/or the second magnet circumferentially enclose the imaging volume along the line oriented along the direction of access to the imaging volume.

In an exemplary embodiment, the at least one magnet is configured as a solenoidal magnet comprising the shape of a tube. The at least one magnet may comprise an arbitrary cross-section, such as a circular, an oval, an elliptical or a polygonal cross-section. The center of the imaging volume may be positioned along an axis of rotational symmetry of the tube, particularly a geometric center of the tube. In one example, the at least one magnet may be a main magnet providing a static magnetic field within the imaging volume. In another example, the at least one magnet may be a gradient magnet comprising a set of gradient coils circumferentially enclosing the imaging volume along the line oriented along the direction of access to the imaging volume.

Likewise, the second magnet may be configured as a solenoid magnet circumferentially enclosing the imaging volume along the line oriented along the direction of access to the imaging volume. Analogous to the at least one magnet, the second magnet may comprise a tubular shape with an arbitrarily shaped cross-section. The second magnet may enclose at least a section of the at least one magnet along at least a part of the line oriented along the direction of access to the imaging volume. However, in an alternative embodiment, the second magnet may also be at least partially enclosed by the at least one magnet along at least a part of the line oriented along the direction of access to the imaging volume.

A diameter of the at least one magnet and/or the second magnet may vary in the direction of access to the imaging volume. In one embodiment, a cross-section of the at least one magnet and/or the second magnet with a minimum diameter essentially coincides with a position of the center of the imaging volume along the line oriented along the direction of access to the imaging volume. In a further example, a first diameter of the at least one magnet and/or the second magnet located at a first distance from the imaging volume exceeds a second diameter of the at least one magnet and/or the second magnet located at a second distance to the imaging volume, wherein the first distance exceeds the second distance. In an exemplary embodiment, the diameter of the at least one magnet and/or the second magnet increases in a direction facing away from the center of the imaging volume along the line oriented along the direction of access to the imaging volume.

In providing a solenoidal magnet with a varying diameter along the line oriented along the direction of access to the imaging volume, an efficiency of the field generator may favorably be enhanced in comparison to conventional solenoidal magnetic resonance imaging devices. Furthermore, an increased diameter of the magnet at an opening or an end of the magnet may favorably facilitate an access of a patient or a body region of the patient to the imaging volume in comparison to existing solenoidal magnetic resonance imaging devices.

According to one embodiment of the inventive magnetic resonance imaging device, the at least one magnet and/or the second magnet comprise at least one of
 a permanent magnet,
 an electromagnet,
 a high-temperature superconducting magnet,
 a low-temperature superconducting magnet.

The at least one magnet and/or the second magnet may consist of coils and/or tubular magnet segments. The coils and/or tubular magnet segments may comprise a wire made from a material with superconducting properties. The wire may be connected to a cryostat to keep a temperature of the wire below a predefined value (e.g. a superconducting temperature). In case of a low-temperature superconducting magnet, liquid helium may be used as a coolant, ensuring a temperature of the wire below 4 K. Low-temperature superconducting magnets may comprise materials such as niobium-titanium, niobium-tin, niobium-germanium and alloys thereof. In contrast, high-temperature superconducting magnets exhibit superconducting properties at temperatures in the range of 30 to 90 K. High-temperature superconducting magnets may comprise materials such as barium-copper-oxide, calcium-copper-oxide, magnesium diboride, but also fullerides and the like. The wire may be wound and/or arranged in a variety of shapes, such as a solenoid, as a substantially planar loop or a tubular magnet segment. In an exemplary embodiment, the wires of the high-temperature superconducting magnet and/or the low-temperature superconducting magnet are embedded within a matrix made of an electrical conductor, such as copper, aluminum, gold and the like.

By using a high-temperature superconducting magnet and/or a low-temperature superconducting magnet, the magnetic field strength provided via the at least one magnet and/or the second magnet may favorably be increased in comparison to a permanent magnet or an electromagnet of comparable size.

A permanent magnet may consist of any suitable magnetic material such as aluminum-nickel-cobalt, neodymium-iron-boron or samarium-cobalt alloys. Furthermore, the surface directed towards the imaging volume of the permanent magnet may comprise the shape of a cone or a frustum. In one embodiment, the permanent magnet may be composed of smaller, stacked permanent magnets. Permanent magnets advantageously provide a low-cost solution for generating a magnetic field within the imaging volume. The use of a permanent magnet may favorably avoid costs and space required for cooling equipment usually associated with superconducting magnets and electromagnets.

An electromagnet may be a non-superconducting magnet. Particularly, an electromagnet may comprise an electrical conductor wound in a predefined pattern. The electrical conductor may be wound around a magnetic core made of, for example, a ferromagnetic or ferrimagnetic material. The magnetic core of the electromagnet may comprise a cylindrical shape, a cuboid shape, a prism shape or any other desirable shape. By using an electromagnet, the magnetic field strength can be favorably increased in comparison to a permanent magnet of comparable size. Higher magnetic field strengths can advantageously enhance a quality and/or a signal-to-noise ratio of a magnetic resonance image acquired via the magnetic resonance imaging device.

According to one embodiment, the at least one magnet and the second magnet confine the imaging volume in two spatial directions oriented at an angle of 180° to one another, wherein a smallest distance between the at least one magnet and a center of the imaging volume is equal or unequal to a smallest distance between the second magnet and the center of the imaging volume.

In case the smallest distance between the center of the imaging volume and the at least one magnet is equal to the smallest distance between the center of the imaging volume and the second magnet, the at least one magnet and the second magnet may be arranged symmetrically with respect to the imaging volume. In a symmetrical arrangement of the at least one magnet and the second magnet with respect to the imaging volume, a volume, a dimension, a shape and/or a curvature of the surfaces directed towards the imaging volume of the at least one magnet and the second magnet may substantially coincide. In providing a symmetrical arrangement of the at least one magnet and the second magnet with respect to the imaging volume, an engineering and/or manufacturing effort for providing different magnets for the field generator may favorably be avoided.

In case the smallest distance between the center of the imaging volume and the at least one magnet is unequal to the smallest distance between the center of the imaging volume and the second magnet, the at least one magnet and the second magnet are arranged asymmetrically with respect to the imaging volume. An asymmetrical arrangement of the at least one magnet and the second magnet with respect to the imaging volume may be characterized by different volumes, dimensions, shapes and/or curvatures of the surfaces directed towards the imaging volume of the at least one magnet and the second magnet. It is also conceivable, that the at least one magnet and the second magnet comprise different magnetic field strengths and/or different magnetic materials. In this case, different volumes of magnetic material and/or different shapes may be required to match the at least one magnet and the second magnet. Thus, the smallest distance between the center of the imaging volume and the at least one magnet may be equal to the smallest distance between the center of the imaging volume and the second magnet. However, the at least one magnet and the second magnet may be arranged asymmetrically with respect to the imaging volume due to differences in volume, dimension, shape and/or curvature of the surface directed towards the imaging volume of the at least one magnet and the second magnet.

In providing an asymmetrical arrangement of the at least one magnet and the second magnet with respect to the imaging volume, the curvatures of the surfaces directed towards the imaging volume of the at least one magnet and the second magnet may individually be matched with a geometry of a specific body region of a patient. Thus, a dimension of a clearance between the at least one magnet and the second magnet and/or a direction of access to the imaging volume may be optimized for imaging of the specific body region. Furthermore, by taking into account the geometry of the specific body region, both the at least one magnet and the second magnet may favorably be positioned closer to the imaging volume, thus enhancing the efficiency of the field generator.

FIG. 1 depicts a schematic representation of an inventive magnetic resonance imaging device 10 configured to perform a magnetic resonance measurement of a jaw region and/or an eye region of a patient 15. An application of the magnetic resonance imaging device 10 for imaging of the jaw region and/or the eye region of the patient 15 is to be understood as an example. The inventive magnetic resonance imaging device 10 may also be configured to perform cardiac imaging, mammography imaging, neurological imaging, urological imaging, orthopedics imaging, prostate imaging or imaging of other body regions of the patient 15.

In the depicted embodiment, the magnetic resonance imaging device 10 comprises a field generator 12 with a first magnet 13 and a second magnet 14. The first magnet 13 and the second magnet 14 are carried by a supporting structure 11 which maintains a predefined distance between the first magnet 13 and the second magnet 14. The supporting structure 11 may be implemented as an iron yoke 18. A free volume between the first magnet 13 and the second magnet 14 represents an image acquisition region 17 configured to receive an examination object 15, e. g. a body region of the patient 15. The image acquisition region 17 is confined by the first magnet 13 and the second magnet 14 in two opposing spatial directions.

The patient 15 may be positioned within the image acquisition region 17 in an upright or standing position. However, the patient 15 may also be positioned in the image acquisition region 17 in a sitting or lying position. In the latter case, the patient 15 may be positioned by means of a dedicated patient positioning device (not shown). However, the magnetic resonance imaging device 10 may also comprise a positioner 29 for adjusting a position and/or an orientation of the field generator 12 with respect to the patient 15. For example, the positioner 29 may comprise a swivel joint configured to rotate the field generator 12 along a rotation direction WX and/or a rotation direction WY. A position of the field generator 12 along a Y-direction and/or a Z-direction may be adjusted via a suitable telescope system and/or rail system mechanically connected to the supporting structure 11. Of course, other embodiments of the supporting structure 11 and/or the positioner 29 are conceivable. In particular, the positioner 29 may further be configured to position the field generator 12 along at least one spatial direction and/or rotate the field generator 12 in at least one rotation direction (not shown).

The surfaces directed towards the imaging volume 30 of the first magnet 13 and the second magnet 14 are curved in such a way, that a perpendicular distance between a line oriented along a direction of access 16 to the imaging volume 30 and a surface directed towards the imaging volume 30 of the first magnet 14 varies along the direction of access 16 to the imaging volume 30. In the depicted embodiment, the first magnet 13 and the second magnet 14 are arranged symmetrically with respect to the imaging volume 30. The surfaces directed towards the imaging volume 30 of the first magnet 13 and the second magnet 14 comprise the shape of a cone or a dome. Due to the curvature of the first magnet 13 and the second magnet 14, a clearance is provided for the shoulders of the patient 15. Thus, a minimum distance between the first magnet 13 and the imaging volume 30 as well as a minimum distance between the second magnet 14 and the imaging volume 30 may be reduced in comparison to conventional C-type magnetic resonance imaging devices while still providing sufficient clearance for the shoulders of the patient 15.

In the shown example, the first magnet 13 and the second magnet 14 are main magnets configured to generate a static magnetic field in the image acquisition region 17. The field generator 12 may further comprise a gradient field system 27 (see FIGS. 4 and 5) with at least one gradient coil 28 for generating a magnetic gradient field used for spatial encoding of magnetic resonance signals acquired during a magnetic resonance measurement. In an exemplary embodiment, the field generator 12 further comprises a radiofrequency system with at least one radiofrequency antenna (not shown) configured to emit a radiofrequency excitation pulse into the image acquisition region 17. The at least one radiofrequency antenna may also be configured to receive magnetic resonance signals from the image acquisition region 17, particularly the imaging volume 30. In one embodiment, the at least one radiofrequency antenna may be configured as a local coil.

In order to control the field generator 12 as well as the at least one radiofrequency antenna, the magnetic resonance imaging device 10 comprises a controller 20. The controller 20 is configured to control the magnetic resonance imaging device 10 to perform a magnetic resonance measurement of the body region of the patient 15 positioned within the imaging volume 30. For this purpose, the controller 20 may comprise a signal connection with a gradient controller 21 and a radiofrequency antenna controller 22. It is also conceivable, that the gradient controller 21 and the radiofrequency antenna controller 22 are integrated within the controller 20. In an exemplary embodiment, the controller 20 may comprise a processing unit 24 configured to coordinate an acquisition of magnetic resonance image data and/or a reconstruction of magnetic resonance image data acquired from the imaging volume 30. Additionally, or alternatively, the processing unit 24 is configured to evaluate and/or process data, such as magnetic resonance signals and/or magnetic resonance image data. In an exemplary embodiment, the controller 20 may include a microcontroller, an analog circuit, a logic unit and the like. In an exemplary embodiment, the processing unit 24 includes processing circuitry (e.g. a processor, such as a CPU, a GPU and the like). Additionally, or alternatively, the controller 20 and/or the processing unit 24 comprise a memory and/or an internal storage, such as a RAM, a ROM, a PROM, an EPROM, an EEPROM, a flash memory, as well as an HDD, an SSD and the like. In an exemplary embodiment, processing circuitry of the processing unit 24 and/or controller 20 is configured to perform one or more functions and/or operations of the processing unit 24 and/or controller 20, including controlling the MR imaging device 10 (and/or one or more components therein), processing magnetic resonance signals, reconstructing magnetic resonance images, processing input from the user of the magnetic resonance imaging device 10 and/or providing an output to the user.

Control information, such as imaging parameters and/or magnetic resonance image data, can be displayed on an output 25. The output 25 may comprise at least one monitor configured to display control information and/or images acquired via the magnetic resonance imaging device 10 to an operator of the magnetic resonance imaging device 10. The magnetic resonance imaging device 10 may further comprise an input 26 configured to receive information and/or parameters input by the operator during an imaging examination. The input 26 may be a keyboard, mouse, touchscreen, microphone, or other input device as would be understood by one of ordinary skill in the art.

The illustrated magnetic resonance imaging device 10 may of course include further components that magnetic resonance imaging devices 10 usually comprise. The general mode of operation of a magnetic resonance imaging device 10 is well-known to the skilled person. Thus, a further description of the general components or a sequencing of a magnetic resonance measurement is not deemed necessary.

FIG. 2 depicts an embodiment of the inventive magnetic resonance imaging device 10, wherein the first magnet 13 and the second magnet 14 are arranged asymmetrically with respect to the imaging volume 30. In the shown example, a volume as well as a height of the first magnet 14 exceeds a volume and a height of the second magnet 14. The first magnet 13 may further comprise a higher magnetic field strength than the second magnet 14. Thus, the imaging volume 30 provided via the first magnet 13 and the second magnet 14 may be shifted towards the surface directed towards the imaging volume 30 of the first magnet 13. Furthermore, a smallest distance between a center of the imaging volume 31 and the first magnet is unequal to the smallest distance between the center of the imaging volume 31 and the second magnet 14.

In the depicted example, the surface directed towards the imaging volume 30 of the second magnet 14 is curved in such a way to accommodate a neck region as well as an upper back region of the patient 15. In contrast, the surface directed towards the imaging volume 30 of the first magnet 13 is curved in such a way to provide clearance for a breast region of the patient 15. As can be seen from FIG. 2, enough clearance is provided to facilitate an access of the patient 15 to the imaging volume 30 along at least two perpendicular spatial directions. For example, the patient 15 may access the imaging volume 30 along the Y-direction as well as the X-direction. The two perpendicular directions of access to the imaging volume 30 are oriented perpendicular to a main direction of magnetic field lines in the imaging volume 30, which substantially coincides with the Z-direction.

FIG. 3 shows a further embodiment of the inventive magnetic resonance imaging device 10, wherein the surface directed towards the imaging volume 30 of the second magnet 14 is curved in such a way, that a perpendicular distance 37 (e.g. 37a, 37b and 37c) between a line oriented along the direction of access 16 to the imaging volume 30 and the surface directed towards the imaging volume 30 of the second magnet 14 is constant along the direction of access 16 to the imaging volume 30. In comparison, the surface directed towards the imaging volume 30 of the first magnet 13 is curved in such a way, that the perpendicular distance 37 (e.g. 37d, 37e and 37f) between the line oriented along the direction of access 16 to the imaging volume 30 and the surface directed towards the imaging volume 30 of the first magnet 13 varies along the direction of access 16 to the imaging volume 30. In the shown example, the first magnet 13 and the second magnet 14 represent main magnets of the field generator 12, which are arranged asymmetrically with respect to the imaging volume 30. However, it is also conceivable that the first magnet 13 and the second magnet 14 are gradient magnets of a gradient system. In this case, the first magnet 13 and the second magnet 14 may each comprise a set of gradient coils, which are configured to generate a magnetic gradient field in the imaging volume 30.

It is conceivable, that the first magnet 13 and the second magnet 14 comprise an axis of rotational symmetry, which passes through the center of the imaging volume 31 and is oriented essentially in parallel to the Z-direction.

FIG. 4 shows a further embodiment of the inventive magnetic resonance imaging device 10 comprising a gradient system 27 including a set of gradient coils 28a and 28b. In the depicted example, a first magnet 13 comprises a first set of gradient coils 28a on one side of the imaging volume 30 and a first set of gradient coils 28b positioned in an essentially opposing direction on the other side of the imaging volume 30. The first set of gradient coils 28a and the first set of gradient coils 28b may be configured as (mirror image) transverse gradient coils with a fingerprint winding pattern. However, other winding patterns are also conceivable. For example, the winding pattern of the first set of gradient coils 28a and the first set of gradient coils 28b may comprise an arrangement of essentially circular or ring-shaped wires according to the lines depicted in FIG. 4. Particularly, the first magnet 13 according to the embodiment shown in FIG. 4 may be configured to generate a magnetic gradient field oriented along the Z-direction. In an alternative embodiment, the element 28a may be interpreted as a first magnet 13 and the element 28b may be interpreted as a second magnet 14.

In the embodiment depicted in FIG. 4, the first set of gradient coils 28a and the shield coil 34a are positioned adjacent to one another. In a similar manner, the first set of gradient coils 28a and a second set of gradient coils (not shown) may be positioned adjacent to one another. In an alternative embodiment, the first set of gradient coils 28a may be positioned adjacent to the first set of gradient coils 28b. In an exemplary embodiment, the first set of gradient coils 28a is positioned adjacent to a shield coil 34a and the first set of gradient coils 28b is positioned adjacent to a shield coil 34b. The shield coils 34a and 34b may be configured to shield the first set of gradient coils 28a and the first set of gradient coils 28b from electromagnetic interference and/or magnetic fields provided by further magnets (e. g. a magnet positioned adjacent to the first set of gradient coils 28a and/or the first set of gradient coils 28b). As depicted in FIG. 4, the shield coil 34a may be positioned adjacent to a surface directed away from the imaging volume 30 of the first set of gradient coils 28a. Likewise, the shield coil 34b may be positioned adjacent to a surface directed away from the imaging volume 30 of the first set of gradient coils 28b. However, the shield coils 34a and 34b may also be positioned adjacent to the surfaces directed towards the imaging volume 30 of the first set of gradient coils 28a and the first set of gradient coils 28b.

According to an alternative embodiment, the magnetic resonance imaging device 10 depicted in FIG. 4 may comprise a second magnet 14 positioned adjacent to the first magnet 13. For example, the second magnet 14 may comprise a second set of gradient coils 28c (see FIG. 5) positioned adjacent to the first set of gradient coils 28a and a second set of gradient coils 28d positioned adjacent to the first set of gradient coils 28b. The second sets of gradient coils 28c and 28d may be positioned in proximity to the shield coils 34a and 34b and comprise a similar shape. In an exemplary embodiment, a shield coil 34a is positioned between a first set of gradient coils 28a and 28b and a second set of gradient coils 28c and 28d. However, the shield coils 34a may also be positioned adjacent to a surface directed away from the imaging volume of a second set of gradient coils 28c and 28d in order to shield the first magnet 13 and the second magnet 14 from a main magnet (not shown) generating a static magnetic field within the imaging volume 30.

FIG. 5 shows a further embodiment of the inventive magnetic resonance imaging device 10 comprising a gradient system 27 with a first magnet 13 configured as a gradient magnet. The first magnet 13 comprises a first set of gradient coils 28a and a first set of gradient coils 28b. The first set of gradient coils 28a and the first set of gradient coils 28b are arranged in such a way, that they confine the imaging volume 30 in two essentially opposing spatial directions. In the depicted embodiment, the wiring pattern of the first set of gradient coils 28a and a first set of gradient coils 28b of the first magnet 13 may be configured to provide a magnetic gradient field oriented along the Y-direction.

According to one embodiment, the inventive magnetic resonance imaging device 10 may further comprise a second magnet 14 including second sets of gradient coils 28c and 28d arranged at two opposing sides of the imaging volume 30. The second sets of gradient coils 28c and 28d may be configured to provide a magnetic gradient field along the X-direction. For this purpose, a winding pattern of the second sets of gradient coils 28c and 28d may essentially correspond to the winding pattern of the first set of gradient coils 28a and the first set of gradient coils 28b but be rotated by an angle of 90° or 270°.

The inventive magnetic resonance imaging device 10 may further comprise a third magnet (not shown). The third magnet may comprise third sets of gradient coils (not shown) with a winding pattern consisting of essentially circular or ring-shaped wires as depicted in FIG. 4 (e. g. the first set of gradient coils 28a). Particularly, the third magnet may represent a gradient magnet configured to provide a magnetic gradient field oriented along the Z-direction. The inventive magnetic resonance imaging device 10 may also comprise shield coils 34a and 34b positioned adjacent to the first magnet 13, the second magnet 14 and/or the third magnet. For example, the shield coils 34a and 34b may be positioned adjacent to the surfaces directed away from the imaging volume 30 of the first sets of gradient coils 28a and 28b, the second sets of gradient coils 28c and 28d and/or the sets of gradient coils of the third magnet. In an exemplary embodiment, the shield coils 34a and 34b may be configured to shield the first magnet 13, the second magnet 14 and/or the third magnet from a main magnet for generating a static magnetic field within the imaging volume 30.

It is conceivable, that the curvature of the surface directed towards the imaging volume 30 of a first set of gradient coils 28a and 28b of the first magnet 13 differs from a curvature of a surface directed towards the imaging volume of a second set of gradient coils 28c and 28d of the second magnet 14. For example, the curvature of the first set of gradient coils 28a may differ from the curvature of the second set of gradient coils 28c. However, the curvatures of the surfaces directed towards the imaging volume 30 of the first set of gradient coils 28a and 28b and the second set of gradient coils 28c and 28d may also be substantially identical.

FIG. 6 shows an embodiment of the inventive magnetic resonance imaging device 10, wherein the first magnet 13 and the second magnet 14 are arranged symmetrically with respect to the imaging volume 30. Thus, a minimum distance between the center of the imaging volume 31 and the surface directed towards the imaging volume 30 of the first magnet 13 may coincide with a minimum distance between the center of the imaging volume 31 and the surface directed towards the imaging volume 30 of the second magnet 14. The first magnet 13 and the second magnet 14 may represent main magnets (or sections of a main magnet) of the field generator 12 configured to provide a static magnetic field in the imaging volume 30. However, the first magnet 13 and the second magnet 14 may also represent gradient magnets, each comprising a set of gradient coils, which are configured to provide a magnetic gradient field within the imaging volume 30.

FIG. 7 depicts an embodiment of the inventive magnetic resonance imaging device 10, wherein the first magnet 13 is configured to enclose at least a part of the imaging volume 30 along at least a part of the direction of access 16 to the imaging volume 30 and wherein the direction of access 16 to the imaging volume 30 is oriented in parallel to a main direction of magnetic field lines within the imaging volume 30. The first magnet 13 may be a gradient magnet including a set of gradient coils 28a enclosing an arc of an imaginary cylinder (not shown) whose cylinder axis corresponds to the line oriented along the direction of access 16 to the imaging volume 30. Likewise, the second magnet 14 may be a gradient magnet including a set of gradient coils 28b enclosing an arc of the imaginary cylinder along the direction of access 16 to the imaging volume 30. For example, an angle defining the arc of the imaginary cylinder enclosed by the first magnet 13 and/or the second magnet 14 may comprise about 180° as depicted in FIG. 7. However, the angle defining the arc of the imaginary cylinder may also comprise a value below 180° or above 180°. In an exemplary embodiment, the first gradient magnet 13 and the second gradient magnet 14 circumferentially enclose the imaging volume 30 in such a way, that the angle defining the arc of the imaginary cylinder comprises a value of essentially 360°. The set of gradient coils 28a of the first magnet 13 and the set of gradient coils 28b of the second magnet 14 may be configured to provide substantially perpendicular magnetic gradient fields within the imaging volume 30. The first gradient magnet 13 and/or the second gradient magnet 14 may comprise fingerprint-like winding patterns oriented in a transverse direction.

In an exemplary embodiment, the first magnet 13 and the second magnet 14 are configured as tubular solenoidal magnets circumferentially enclosing the imaging volume 30 along at least a part of the direction of access 16 to the imaging volume 30. For example, the set of gradient coils 28a and the set of gradient coils 28b may circumferentially enclose the imaging volume 30 and/or the patient 15 along the line oriented along the direction of access 16 to the imaging volume 30. The diameter 33 of the set of gradient coils 28a and/or the set of gradient coils 28b may vary along the direction of access 16 to the imaging volume 30. Particularly, a minimum diameter 33 of the set of gradient coils 28a and/or the set of gradient coils 28b may be located at the center of the imaging volume 31.

In an alternative embodiment, the second magnet 14 may be configured as a conventional solenoid with a cylindrical shape circumferentially enclosing the first magnet 13 along the direction of access 16 to the imaging volume 30. The inventive magnetic resonance imaging device 10 may also comprise a main magnet (not shown) for generating a static magnetic field within the imaging volume 30. The main magnet may comprise a conventional cylindrical shape or a tube-shape according to the first magnet 13. As described above, the inventive magnetic resonance imaging device 10 may also comprise a shield coil 34 positioned adjacent to the first magnet 13 and/or the second magnet 14.

In a further embodiment, the elements 13 and 14 represent sections of a main magnet configured to provide a static magnetic field within the imaging volume 30. For example, the elements 13 and 14 may represent an outer surface 14 and an inner surface 13 of the main magnet. It is also conceivable, that the first magnet 13 comprises a shield coil 34 positioned adjacent to the surface directed away from the imaging volume 30 or directed towards the imaging volume 30 of the first magnet 13.

The diagram in FIG. 8 depicts a dependency between a slew rate of a gradient magnet with a curved surface directed towards the imaging volume 30 according to an embodiment of the inventive magnetic imaging device 10 as a function of a gap for a patient bore. The gap for the patient bore may relate to a minimum distance between the surfaces directed towards the imaging volume 30 of first magnet 13 and the second magnet 14 as depicted in FIGS. 1 to 6. According to FIG. 8, the slew rate of a gradient system increases when the distance between the first magnet 13 and the second magnet 14 at the imaging volume 30 decreases. Thus, an efficiency of the field generator 12 (as represented by the slew rate) increases when using a curved surface directed towards the imaging volume 30 according to an embodiment described above. In one example, the gap for a patient bore of a conventional magnetic resonance imaging device may be about 44 cm, whereas the gap for the patient bore according to an embodiment of the inventive magnetic resonance imaging device 10 may be around 26 cm, thus increasing the slew rate from about 100 mT/m/ms to over 750 mT/m/ms.

The embodiments described above are to be recognized as examples. Individual embodiments may be extended by features of other embodiments.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A magnetic resonance imaging (MRI) device comprising:
a field generator configured to provide a magnetic field in an imaging volume of the MRI device, the field generator including at least one magnet that confines the imaging volume in at least one spatial direction, wherein:
the at least one magnet is curved such that a perpendicular distance between a line oriented along a direction of access to the imaging volume and a surface directed towards the imaging volume of the at least one magnet varies in the direction of access to the imaging volume,
the at least one magnet is configured to enclose at least a part of the imaging volume along at least a part of the line oriented along the direction of access to the imaging volume, the direction of access to the imaging volume being oriented in parallel to a main direction of magnetic field lines within the imaging volume, and
the at least one magnet is arranged such that a minimum perpendicular distance between the line oriented along the direction of access to the imaging volume and the surface directed towards the imaging volume of the at least one magnet is located at a center of the imaging volume.

2. The MRI device according to claim 1, wherein:
the field generator comprises a second magnet configured to enclose at least a part of the imaging volume along at least a part of the line oriented along the direction of access to the imaging volume; and
the second magnet is curved such that a perpendicular distance between the line oriented along the direction of access to the imaging volume and the surface directed towards the imaging volume of the second magnet varies in the direction of access to the imaging volume.

3. The MRI device according to claim 2, wherein the at least one magnet and/or the second magnet circumferentially enclose the imaging volume along the line oriented along the direction of access to the imaging volume.

4. A magnetic resonance imaging (MRI) device, comprising:
a field generator configured to provide a magnetic field in an imaging volume of the MRI device, the field generator including at least one magnet that confines the imaging volume in at least one spatial direction,
wherein the at least one magnet is curved such that a perpendicular distance between a line oriented along a direction of access to the imaging volume and a surface directed towards the imaging volume of the at least one magnet varies in the direction of access to the imaging volume,
wherein the at least one magnet is configured as a gradient magnet comprising a set of gradient coils configured to generate a magnetic gradient field in the imaging volume, and
wherein the at least one magnet is arranged such that a minimum perpendicular distance between the line oriented along the direction of access to the imaging volume and the surface directed towards the imaging volume of the at least one magnet is located at a center of the imaging volume.

5. The MRI device according to claim 4, wherein the field generator comprises a second magnet including a second set of gradient coils configured to generate a second magnetic gradient field in the imaging volume, and
   wherein the second magnetic gradient field is oriented perpendicular to the magnetic gradient field provided via the at least one magnet.

6. The MRI device according to claim 5, wherein the surface directed towards the imaging volume of the second magnet is shaped such that the perpendicular distance between the line oriented along the direction of access to the imaging volume and the surface directed towards the imaging volume of the second magnet is constant in the direction of access to the imaging volume.

7. The MRI device according to claim 6, wherein the at least one magnet and the second magnet are positioned adjacent to one another.

8. The MRI device according to claim 5, wherein the second magnet is curved such that a perpendicular distance between the line oriented along the direction of access to the imaging volume and the surface directed towards the imaging volume of the second magnet varies in the direction of access to the imaging volume,
   wherein a curvature of the second magnet is different from a curvature of the at least one magnet.

9. The MRI device according to claim 8, wherein the at least one magnet and the second magnet are positioned adjacent to one another.

10. The MRI device according to claim 4, wherein the at least one magnet is configured to enclose at least a part of the imaging volume along at least a part of the line oriented along the direction of access to the imaging volume, the direction of access to the imaging volume being oriented in parallel to a main direction of magnetic field lines within the imaging volume.

11. A magnetic resonance imaging (MRI) device, comprising:
   a field generator configured to provide a magnetic field in an imaging volume of the MRI device, the field generator including a first magnet and a second magnet that confine the imaging volume in two spatial directions oriented at an angle of 180° to one another, the first magnet and the second magnet being arranged asymmetrically with respect to the imaging volume and being arranged to provide an access to the imaging volume along at least two perpendicular spatial directions, wherein:
   a smallest distance between the first magnet and a center of the imaging volume is unequal to a smallest distance between the second magnet and the center of the imaging volume,
   the first magnet is curved such that a perpendicular distance between a line oriented along a direction of access to the imaging volume and a surface directed towards the imaging volume of the first magnet varies in the direction of access to the imaging volume, and
   the direction of access to the imaging volume along each of the at least two perpendicular spatial directions is angled with respect to a main direction of magnetic field lines within the imaging volume.

12. The MRI device according to claim 11, wherein the surface directed towards the imaging volume of the at least one magnet is cone shaped or frustum shaped.

13. A magnetic resonance imaging (MRI) device comprising:
   a field generator configured to provide a magnetic field in an imaging volume of the MRI device, the field generator comprising:
      at least one magnet that confines the imaging volume in a spatial direction; and
      a second magnet, wherein:
      a curvature of the second magnet is different from a curvature of the at least one magnet,
      the at least one magnet and the second magnet are arranged to provide access to the imaging volume along a first direction of access and a second direction of access, respectively, which correspond to two perpendicular spatial directions,
      the at least one magnet is curved such that a perpendicular distance between a line oriented along the first direction of access to the imaging volume and a surface directed towards the imaging volume of the at least one magnet varies in the first direction of access to the imaging volume,
      the at least one magnet is configured to enclose at least a part of the imaging volume along at least a part of the line oriented along the first direction of access to the imaging volume, and
      the first direction of access and the second direction of access to the imaging volume along each of the at least two perpendicular spatial directions, respectively, are angled with respect to the main direction of magnetic field lines within the imaging volume.

14. The MRI device according to claim 13, wherein a surface directed towards the imaging volume of the second magnet is curved such that a perpendicular distance between the line oriented along the first direction of access to the imaging volume and the surface directed towards the imaging volume of the second magnet varies in the first direction of access to the imaging volume.

15. The MRI device according to claim 13, wherein a surface directed towards the imaging volume of the second magnet is shaped such that a perpendicular distance between the line oriented along the first direction of access to the imaging volume and the surface directed towards the imaging volume of the second magnet is constant in the first direction of access to the imaging volume.

16. The MRI device according to claim 13, wherein the at least one magnet and/or the second magnet are configured to generate a static magnetic field in the imaging volume, and
   wherein the static magnetic field is homogenous throughout the imaging volume, or wherein the static magnetic field comprises a predefined magnetic field gradient across the imaging volume.

17. The MRI device according to claim 13, wherein the at least one magnet and/or the second magnet comprise:
   a permanent magnet,
   an electromagnet,
   a high-temperature superconducting magnet, and/or
   a low-temperature superconducting magnet.

18. The MRI device according to claim 13, wherein:
   the at least one magnet and the second magnet confine the imaging volume in two respective spatial directions oriented at an angle of 180° to one another,
   a smallest distance between the at least one magnet and a center of the imaging volume is equal to a smallest distance between the second magnet and the center of the imaging volume, and
   the at least one magnet and the second magnet are arranged symmetrically with respect to the imaging volume.

19. The MRI device according to claim 13, wherein;
   the at least one magnet and the second magnet confine the imaging volume in two spatial directions oriented at an angle of 180° to one another, a smallest distance between the at least one magnet and a center of the imaging volume is unequal to a smallest distance between the second magnet and the center of the imaging volume, and the at least one magnet and the second magnet are arranged asymmetrically with respect to the imaging volume.

\* \* \* \* \*